United States Patent
Li et al.

(10) Patent No.: US 9,430,981 B2
(45) Date of Patent: Aug. 30, 2016

(54) DISPLAY PANEL

(71) Applicant: Chunghwa Picture Tubes, LTD., Taoyuan (TW)

(72) Inventors: Wei-Lung Li, Taoyuan County (TW); Chih-Wen Lai, Nantou County (TW)

(73) Assignee: Chunghwa Picture Tubes, LTD., Taoyuan (TW)

( * ) Notice: Subject to any disclaimer, the term of this patent is extended or adjusted under 35 U.S.C. 154(b) by 429 days.

(21) Appl. No.: 13/939,192

(22) Filed: Jul. 11, 2013

(65) Prior Publication Data

US 2014/0320386 A1    Oct. 30, 2014

(30) Foreign Application Priority Data

Apr. 26, 2013   (TW) .............................. 102115086 A

(51) Int. Cl.
　　*G09G 3/36*　　(2006.01)
　　*G11C 19/28*　　(2006.01)
(52) U.S. Cl.
　　CPC ............. *G09G 3/3677* (2013.01); *G11C 19/28* (2013.01); *G09G 2310/0286* (2013.01)
(58) Field of Classification Search
　　None
　　See application file for complete search history.

(56) References Cited

U.S. PATENT DOCUMENTS

2008/0219401 A1*   9/2008   Tobita .................. G09G 3/3677
　　　　　　　　　　　　　　　　　　　　　　　　377/79

FOREIGN PATENT DOCUMENTS

TW             543145          7/2003
TW          200604694          2/2006

* cited by examiner

*Primary Examiner* — Kathy Wang-Hurst
*Assistant Examiner* — Jose Soto Lopez
(74) *Attorney, Agent, or Firm* — Jianq Chyun IP Office

(57) ABSTRACT

A display panel includes a substrate, a plurality of pixels, a plurality of scan lines, a pull-down control circuit, and a gate driving circuit. The pixels are disposed on a display area of the substrate. The scan lines are disposed on the substrate and respectively coupled to the corresponding pixels. The pull-down control circuit is disposed on a peripheral area of the substrate, receives a plurality of clock signals, and has a plurality of pull-down units to provide a plurality of pull-down signals. The gate driving circuit is disposed on the peripheral area and has a plurality of shift registers. The shift registers are coupled to the scan lines to provide a plurality of gate driving signals and pull down the gate driving signals in sequence according to the pull-down signals. The pull-down control circuit and the gate driving circuit are arranged along a side of the display area.

12 Claims, 9 Drawing Sheets

DISPLAY PANEL

CROSS-REFERENCE TO RELATED APPLICATION

This application claims the priority benefit of Taiwan application serial no. 102115086, filed on Apr. 26, 2013. The entirety of the above-mentioned patent application is hereby incorporated by reference herein and made a part of this specification.

BACKGROUND OF THE INVENTION

1. Field of Invention

The invention relates to a display panel, and especially, to a display panel having a multi-split type (MST) circuit architecture.

2. Description of Related Art

In recent years, as semiconductor technology flourishes, portable electronic products and flat display products have been developed accordingly. Due to the driving modes and the display effects, active display panels have been commonly used. In general, pixels in the active display panel are turned on through gate driving signals provided by gate driving chips, so as to set the brightness (or gray-level values) displayed by the pixels. In order to reduce production costs of liquid crystal displays, some of the manufacturers have brought forward the application of thin film transistors (TFT) directly on glass substrates to make multi-stage shift registers, thereby replacing the conventionally used gate driving chips to reduce production costs of flat displays.

In flat displays, the circuit area of the shift registers disposed in the display panel affects the circuit area of the pixels disposed in the display panel, which relatively affects the overall size and appearance of the flat displays. Therefore, relevant display industries have already invested in slim border design in order to make slim and compact displays without sacrificing the display quality, so as to satisfy consumers' requirements.

SUMMARY OF THE INVENTION

The invention provides a display panel which removes control units from a gate driving circuit to reduce a circuit area of the gate driving circuit and to further slim down a border of the display panel.

The invention provides a display panel which includes a substrate, a plurality of pixels, a plurality of scan lines, a pull-down control circuit, and a gate driving circuit. The substrate has a display area and a peripheral area. The pixels are disposed on the display area. The scan lines are disposed on the substrate, are respectively coupled to the corresponding pixels, and extend from the display area to the peripheral area. The pull-down control circuit is disposed on the peripheral area, receives a plurality of clock signals, and has a plurality of pull-down units to provide a plurality of first pull-down signals. The gate driving circuit is disposed on the peripheral area and has a plurality of shift registers. The shift registers are coupled to the scan lines to provide a plurality of gate driving signals, and the shift registers are coupled to the pull-down control circuit to receive the first pull-down signals. The shift registers enable the gate driving signals in sequence according to the clock signals and pull down the gate driving signals in sequence according to the first pull-down signals, respectively. The pull-down control circuit and the gate driving circuit are arranged along a side of the display area.

In light of the above, in the embodiments of the invention, the display panel removes the pull-down control units from the shift registers of the gate driving circuit, so that the removed pull-down control units become an independent pull-down control circuit. Furthermore, in the embodiments of the invention, the gate driving circuit and the pull-down control circuit of the display panel are arranged in sequence along a side of the display area to reduce the circuit area of the gate driving circuit and to slim down the border of the display panel.

DESCRIPTION OF EMBODIMENTS

Figure 1:
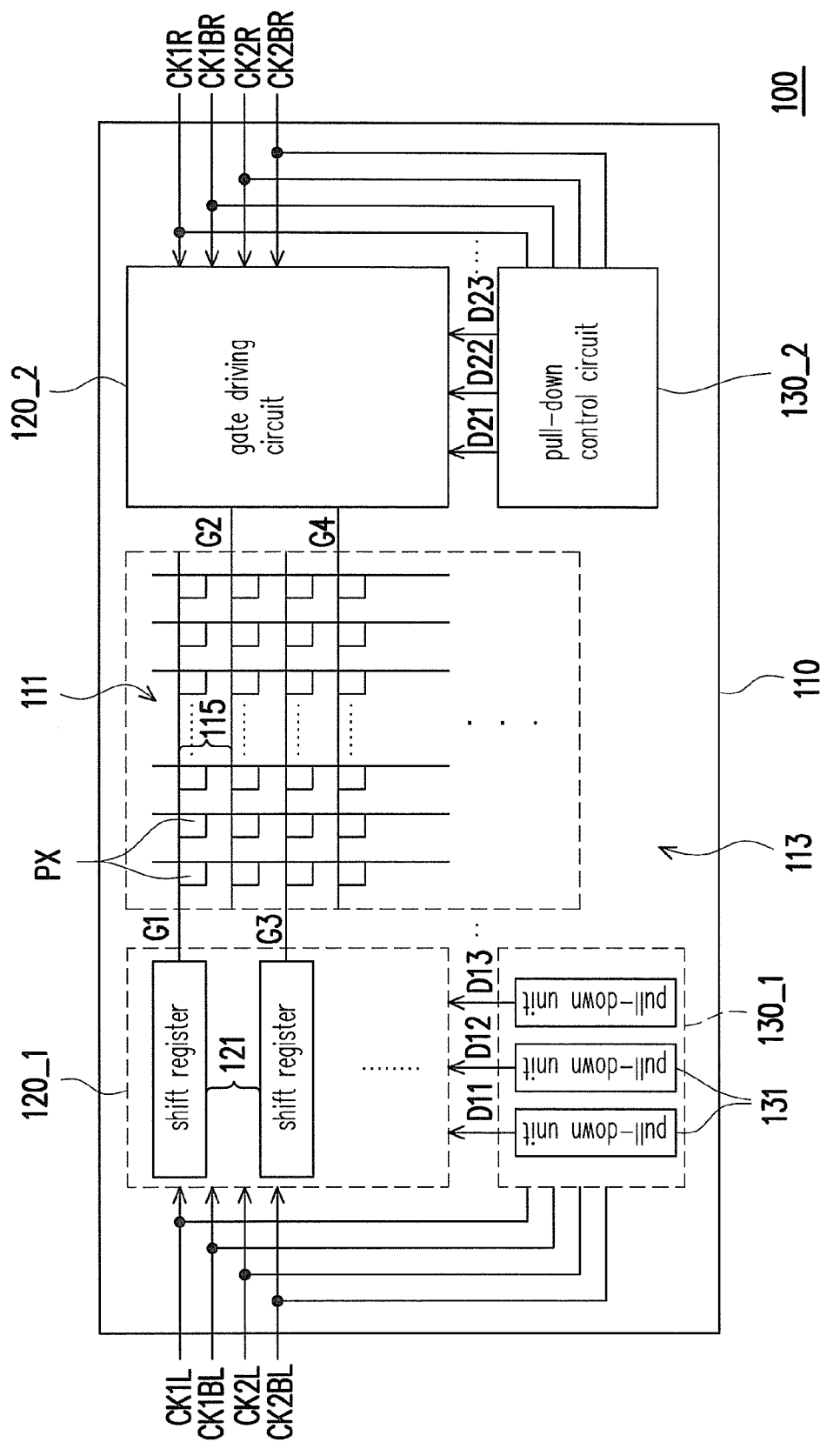
FIG. 1 is a schematic system diagram of a display panel according to an embodiment of the invention.

FIG. 1 is a schematic system diagram of a display panel according to an embodiment of the invention. The display panel 100 includes a substrate 110, a plurality of pixels PX, a plurality of scan lines 115, gate driving circuits 120_1 and 120_2, and pull-down control circuits 130_1 and 130_2. The substrate 100 has a display area 111 and a peripheral area 113. The pixels PX are disposed on the display area 111. The scan lines 115 are disposed on the substrate 111, are respectively coupled to the corresponding pixels PX, and extend from the display area 111 to the peripheral area 113, so that the scan lines 115 are coupled to the corresponding gate driving circuits (such as 120_1 and 120_2).

The pull-down control circuit 130_1 is disposed on the peripheral area 113, receives a plurality of clock signals (e.g., four clock signals CK1L, CK1BL, CK2L, and CK2BL), and has a plurality of pull-down units 131 to provide a plurality of the first pull-down signals (such as D11 to D13). Similarly, the pull-down control circuit 130_2 is also disposed on the peripheral area 113 and receives a plurality of clock signals (e.g., four clock signals CK1R, CK1BR, CK2R, and CK2BR) to provide a plurality of first pull-down signals (such as D21 to D23), wherein operation of the pull-down control circuit 130_2 may refer to that of the pull-down control circuit 130_1. Herein, phases of the clock signals CK1L, CK1BL, CK2L, and CK2BL, which are received by the pull-down control circuit 130_1, can respectively lead those of the clock signals CK1R, CK1BR, CK2R, and CK2BR, which are received by the pull-down control circuit 130_2.

The gate driving circuit 120_1 is disposed on the peripheral area 113 and has a plurality of shift registers 121. The shift registers 121 are coupled to one of the scan lines 115 respectively to provide a plurality of odd-numbered gate driving signals (such as G1 and G3) to the scan lines 115. Moreover, the shift registers 121 are coupled to the pull-down control circuit 130_1 to receive the corresponding first pull-down signals (such as D11 to D13). The shift registers 121 enable the odd-numbered gate driving signals (such as G1 and G3) in sequence according to the clock signals CK1L, CK1BL, CK2L, and CK2BL and pull down the odd-numbered gate driving signals (such as G1 and G3) in sequence according to the first pull-down signals (such as D11 to D13) respectively, wherein the pull-down control circuit 130_1 and the gate driving circuit 120_1 are arranged in sequence along a left side of the display area 111.

The gate driving circuit 120_2 is disposed on the peripheral area 113, wherein the gate driving circuit 120_2 is coupled to the scan lines 115 to provide a plurality of even-numbered gate driving signals (such as G2 and G4) to the scan lines 115 and is coupled to the pull-down control circuit 1302 to receive the corresponding first pull-down signals (such as D21 to D23). The gate driving circuit 120_2 enables the even-numbered gate driving signals (such as G2 and G4) in sequence according to the clock signals CK1R, CK1BR, CK2R, and CK2BR and pull down the even-numbered gate driving signals (such as G2 and G4) in sequence according to the first pull-down signals (such as D21 to D23) respectively, wherein operation of the gate driving circuit 120_2 may refer to that of the gate driving circuit 120_1, and the pull-down control circuit 130_2 and the gate driving circuit 120_2 are arranged in sequence along a right side of the display area 111.

According to the above, since the gate driving circuits 120_1 and 120_2 pull down the gate driving signals (such as G1 to G4) according to the first pull-down signals (such as D11 to D13 and D21 to D23), circuits of the shift registers 121 used to decide the pull-down time sequence of the gate driving signals (such as G1 to G4) may be removed without affecting operation of the shift registers 121. Thereby, the circuit area of the gate driving circuits 120_1 and 120_2 may be reduced, so as to slim down a border of the display panel.

Additionally, in the present embodiment, the pull-down control circuit 130_1 is disposed below the gate driving circuit 120_1. In other embodiments, however, the pull-down control circuit 130_1 may be disposed above the gate driving circuit 120_1 or the pull-down control circuit 130_1 may be disposed both sides of below and above the gate driving circuit 120_1 at the same time, which may be modified by those having ordinary skill in the art. Similarly, the pull-down control circuit 130_2 may not only be disposed below the gate driving circuit 120_2 but also be disposed above the gate driving circuit 120_2 or the pull-down control circuit 130_2 may be disposed both sides of below and above the gate driving circuit 120_2 at the same time.

Figure 2A:
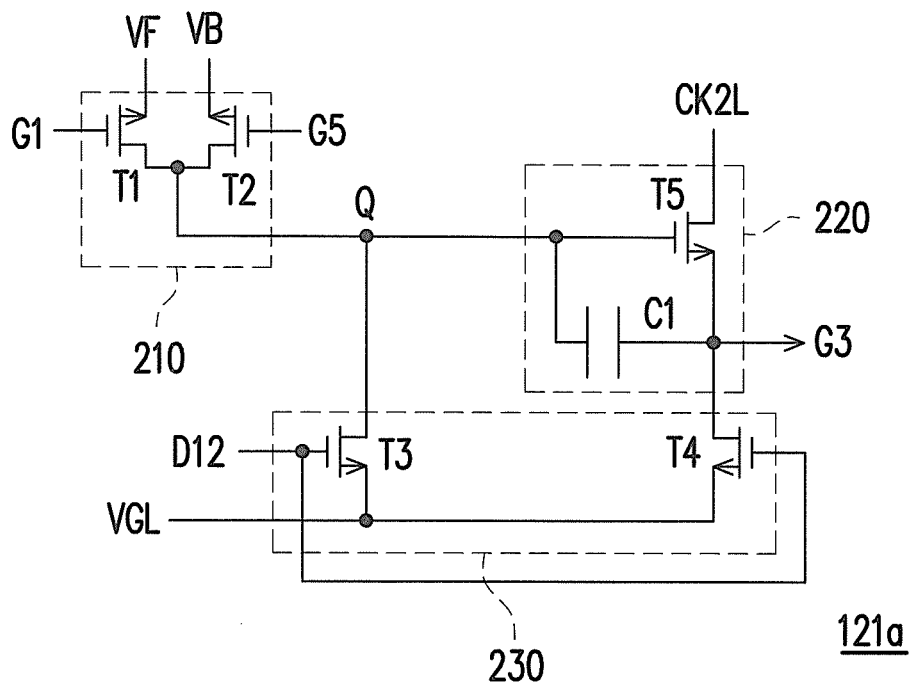
FIG. 2A is a schematic circuit diagram of a shift register according to an embodiment of the invention.

FIG. 2A is a schematic circuit diagram of a shift register according to an embodiment of the invention. Please refer to FIG. 1 and FIG. 2A. In the present embodiment, the shift register 121*a* is an example of the shift register 121 in the gate driving circuit 120_1, and the exemplary shift register 121 outputs the gate driving signal G3 (corresponding to the $i^{th}$ gate driving signal, wherein i is an positive integer). In addition, the shift register 121*a* is assumed to be capable of performing bidirectional scanning and receiving the first pull-down signal D12. In the present embodiment, the shift register 121*a* includes a pre-charge unit 210, a voltage push-up unit 220, and a voltage pull-down unit 230. The pre-charge unit 210 includes transistors T1 and T2 (corresponding to the first transistor and the second transistor). The voltage push-up unit 220 includes a transistor T5 (corresponding to the fifth transistor) and a capacitor C1 (corresponding to the first capacitor). The voltage pull-down unit 230 includes transistors T3 and T4 (corresponding to the third transistor and the fourth transistor).

A source of the transistor T1 (corresponding to the first terminal) receives a forward scanning voltage VF, a drain of the transistor T1 (corresponding to the second terminal) is coupled to an internal voltage Q, and a gate of the transistor T1 (corresponding to the control terminal) receives the gate driving signal G1 (corresponding to the $(i-1)^{th}$ gate driving signal). A source of the transistor T2 (corresponding to the first terminal) receives a reverse scanning voltage VB, a drain of the transistor T2 (corresponding to the second terminal) is coupled to the internal voltage Q, and a gate of the transistor T2 (corresponding to the control terminal) receives the gate driving signal G5 (corresponding to the $(i+1)^{th}$ gate driving signal). The forward scanning voltage VF is one of a gate high voltage (such as 15 volts) and a gate low voltage VGL (such as −10 volts), and the reverse scanning voltage VB is the other one of the gate high voltage and the gate low voltage. In other words, when the display panel 100 performs forward scanning, the forward scanning voltage VF is the gate high voltage, and the reverse scanning voltage VB is the gate low voltage; when the display panel 100 performs reverse scanning, the forward scanning voltage VF is the gate low voltage, and the reverse scanning voltage VB is the gate high voltage.

According to the above, when the display panel 100 performs forward scanning, and the gate driving signal G1 is enabled, the enabled gate driving signal G1 charges the internal voltage Q through the turned-on transistor T1; when the display panel 100 performs reverse scanning, and the gate driving signal G5 is enabled, the enabled gate driving signal G5 charges the internal voltage Q through the turned-on transistor T2. Therefore, the pre-charge unit 210 can pre-charge the internal voltage Q.

A drain of the transistor T5 (corresponding to the first terminal) receives the clock signal CK2L (corresponding to the first clock signal), a source of the transistor T5 (corresponding to the second terminal) is coupled to the gate driving signal G3, and a gate of the transistor T5 (corresponding to the control terminal) receives the internal voltage Q. The capacitor C1 is coupled between the source and the drain of the transistor T5. Therefore, the voltage push-up unit 220 can push up the gate driving signal G3 according to the internal voltage Q.

A drain of the transistor T3 (corresponding to the first terminal) receives the internal voltage Q, a source of the transistor T3 (corresponding to the second terminal) receives the gate low voltage VGL, and a gate of the transistor T3 (corresponding to the control terminal) receives the corresponding first pull-down signal D12. Therefore, the voltage pull-down unit 230 can pull down the internal voltage Q and the gate driving signal G3 according to the first pull-down signal D12.

Figure 2B:
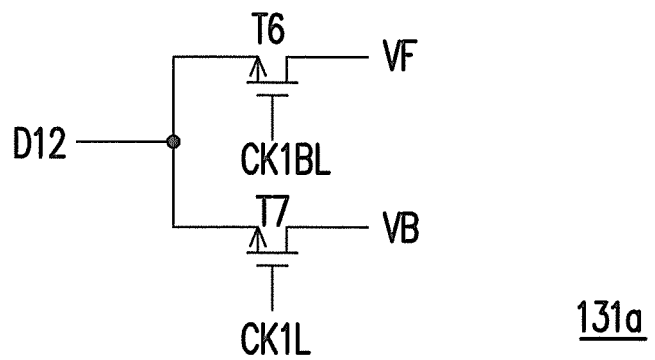
FIG. 2B is a schematic circuit diagram of a pull-down unit according to an embodiment of the invention.

FIG. 2B is a schematic circuit diagram of a pull-down unit according to an embodiment of the invention. Please refer to FIG. 1 and FIG. 2B. In the present embodiment, the pull-down unit 131a includes transistors T6 and T7 (corresponding to the sixth transistor and the seventh transistor). A drain of the transistor T6 (corresponding to the first terminal) receives the forward scanning voltage VF, a source of the transistor T6 (corresponding to the second terminal) is coupled to the first pull-down signal D12, and a gate of the transistor T6 (corresponding to the control terminal) receives the clock signal CK1BL (corresponding to the second clock signal). A drain of the transistor T7 (corresponding to the first terminal) receives the reverse scanning voltage VB, a source of the transistor T7 (corresponding to the second terminal) is coupled to the first pull-down signal D12, and a gate of the transistor T7 (corresponding to the control terminal) receives the clock signal CK1L (corresponding to the third clock signal). The forward scanning voltage VF and the reverse scanning voltage VB may be set in the same manner as described in the embodiment shown in FIG. 2A and is thus not reiterated herein.

Figure 2C:
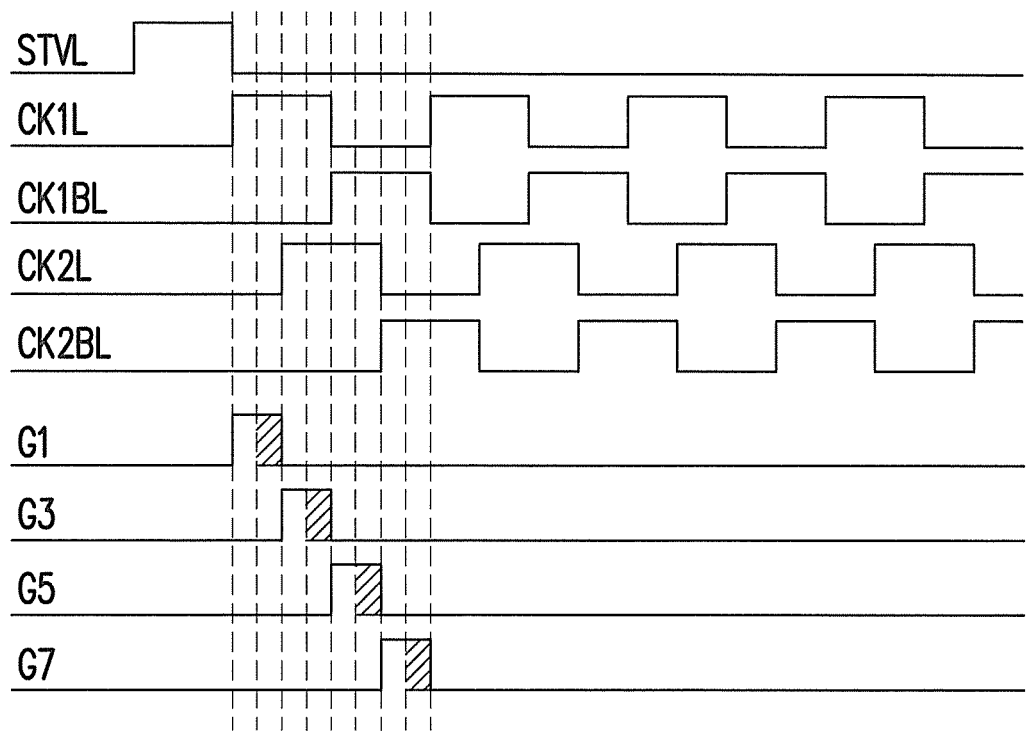
FIG. 2C is a schematic waveform diagram of clock signals and gate driving signals according to an embodiment of the invention.

FIG. 2C is a schematic waveform diagram of clock signals and gate driving signals according to an embodiment of the invention. Please refer to FIG. 1, FIG. 2A, FIG. 2B, and FIG. 2C. In the present embodiment, enabling periods of the clock signals CK1L, CK1BL, CK2L and CK2BL partially overlap with one another and are not exactly the same, wherein the clock signal CK1BL can be regarded as an inverse signal of the clock signal CK1L (that is, having 180-degree phase difference), and the clock signal CK2BL can be regarded as an inverse signal of the clock signals CK2L (that is, having 180-degree phase difference). Herein, the display panel 100 performing forward scanning is exemplified for illustration, and the display panel 100 performing reverse scanning can then be understood accordingly.

When the gate driving signal G1 is enabled, the forward scanning voltage VF, which is the gate high voltage, precharges the internal voltage Q. When the clock signal CK2L is enabled, the voltage level of the gate driving signal G2 is pushed up (which is regarded as enabling). When the clock signal CK1BL is enabled, the voltage level of the first pull-down signal D12 is pushed up (which is regarded as enabling), so that the voltage level of the internal voltage Q and the voltage level of the gate driving signal G3 are pulled down to the gate low voltage VGL. According to the above, the enabling period of the clock signal CK2L and the enabling period of the clock signal CK1BL partially overlap, and the enabling period of the clock signal CK2L and the enabling period of the clock signal CK1L partially overlap. Moreover, a phase of the clock signal CK2L leads that of the clock signal CK1BL, and the phase of the clock signal CK2L lags that of the clock signal CK1L.

As shown in FIG. 2A, when the shift register 121a is assumed to output the gate driving signal G1, the gate of the transistor T1 can be coupled to a start signal STVL, so that the pre-charge unit 210 of the shift register 121a, which outputs the gate driving signal G1, can pre-charge the internal voltage.

Figure 3A:
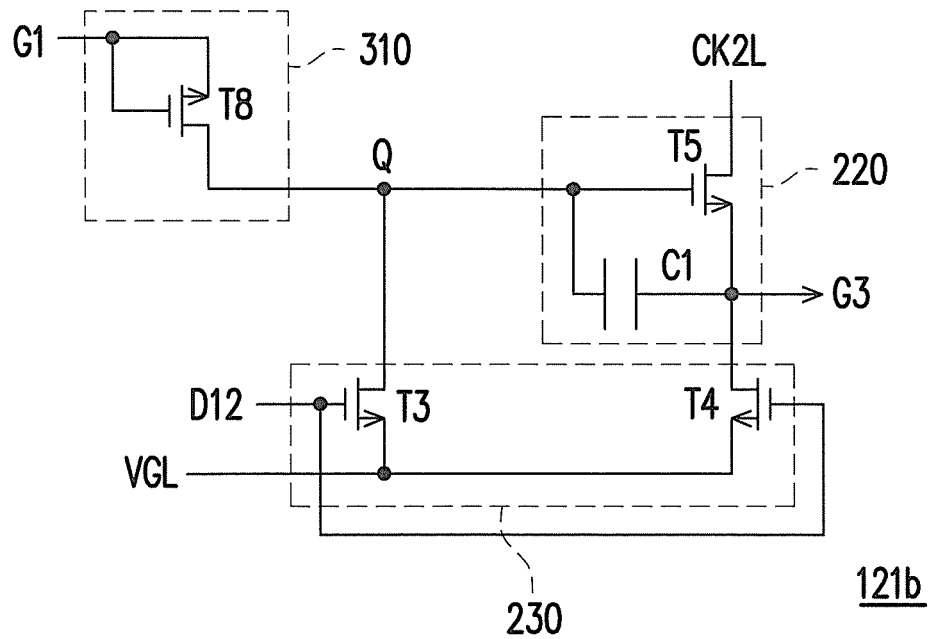
FIG. 3A is a schematic circuit diagram of a shift register according to another embodiment of the invention.

FIG. 3A is a schematic circuit diagram of another shift register according to another embodiment of the invention. Please refer to FIG. 1, FIG. 2A, and FIG. 3A. In the present embodiment, the shift register 121b is substantially the same as the shift register 121a. The shift register 121b is assumed to perform unidirectional scanning, wherein the same or similar reference numbers as those in the first embodiment are used herein to represent the same or similar components. The difference between the shift registers 121a and 121b lies in a pre-charge unit 310 of the shift register 121b. Specifically, the pre-charge unit 310 includes a transistor T8 (corresponding to the ninth transistor). A source (corresponding to the first terminal) and a gate (corresponding to the control terminal) of the transistor T8 receive the gate driving signal G1, and a drain (corresponding to the second ten final) of the transistor T8 is coupled to the internal voltage Q.

Figure 3B:
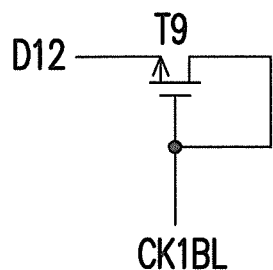
FIG. 3B is a schematic circuit diagram of a pull-down unit according to another embodiment of the invention.

FIG. 3B is a schematic circuit diagram of a pull-down unit according to another embodiment of the invention. Please refer to FIG. 1 and FIG. 3B. In the present embodiment, a pull-down unit 131b includes a transistor T9 (corresponding to the eighth transistor). A drain (corresponding to the first terminal) and a gate (corresponding to the control terminal) of the transistor T9 receive the clock signal CK1BL (corresponding to the fourth clock signal), and a source of the transistor T9 (corresponding to the second terminal) is coupled to the first pull-down signal D12. As shown in FIG. 2C, the enabling period of the clock signal CK2L and the enabling period of the clock signal CK1BL partially overlap, and the phase of the clock signal CK2L leads that of the clock signal CK1BL.

Figure 4:
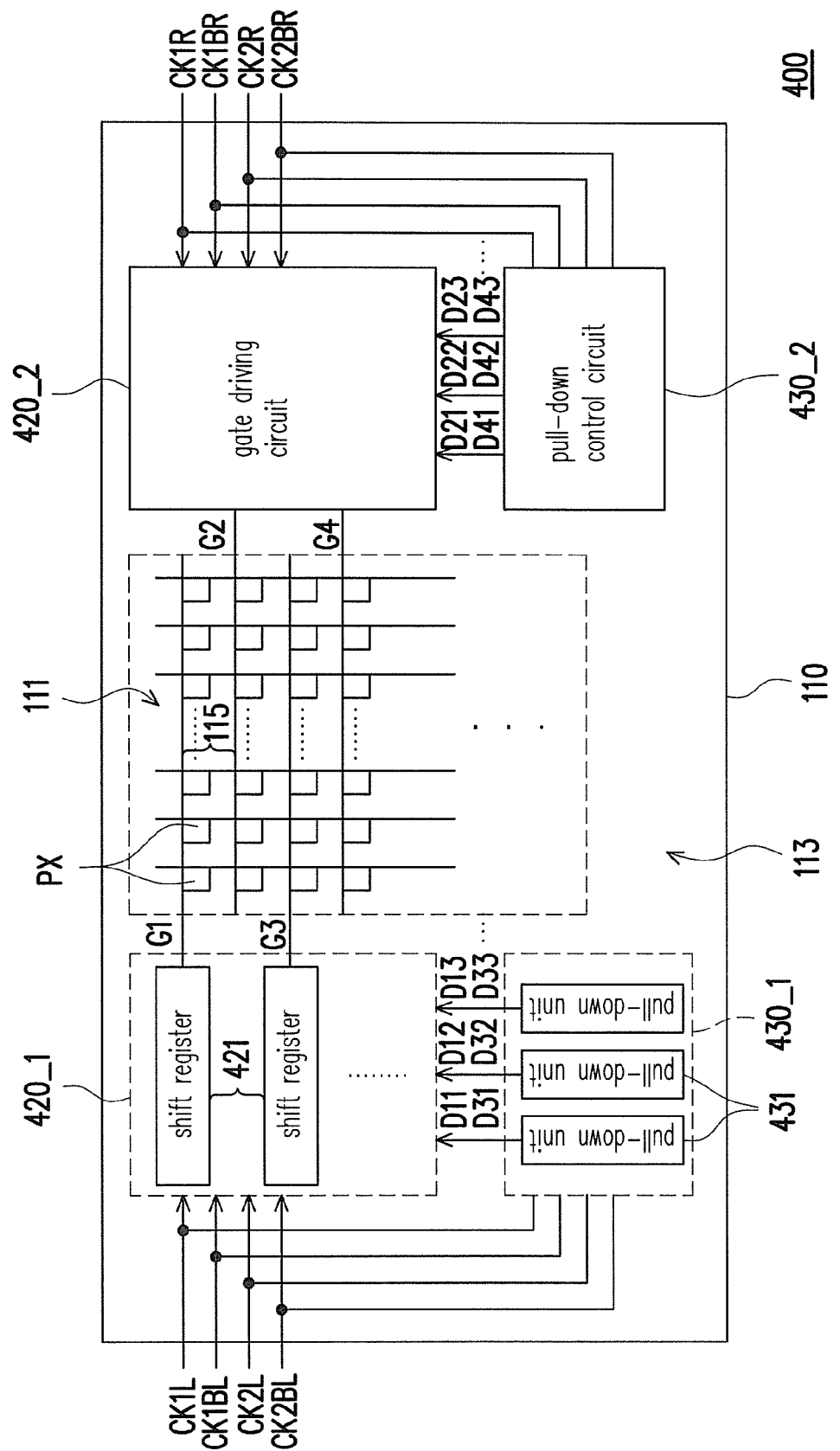
FIG. 4 is a schematic system diagram of a display panel according to another embodiment of the invention.

FIG. 4 is a schematic system diagram of a display panel according to another embodiment of the invention. Please refer to FIG. 1 and FIG. 4. The display panel 400 is substantially the same as the display panel 100. The differences between the display panels 400 and 100 lie in gate driving circuits 420_1 and 420_2 and pull-down control circuits 430_1 and 430_2, wherein the same or similar reference numbers are used herein to represent the same or similar components. The pull-down control circuit 430_1 has a plurality of pull-down units 431 to provide a plurality of the first pull-down signals (such as D11 to D13) and a plurality of the second pull-down signals (such as D31 to D33) to the gate driving circuit 420_1. The pull-down control circuit 430_2 provides a plurality of the first pull-down signals (such as D21 to D23) and a plurality of the second pull-down signals (such as D41 to D43) to the gate driving circuit 4202, wherein operation of the pull-down control circuit 430_2 may refer to that of the pull-down control circuit 430_1.

The gate driving circuit 420_1 has a plurality of shift registers 421 to provide a plurality of odd-numbered gate driving signals (such as G1 and G3), and each shift register 421 pulls down the corresponding odd-numbered gate driving signal (such as G1 and G3) and its internal voltage Q according to the corresponding first pull-down signal (such as D11 to D13) and the corresponding second pull-down signal (such as D31 to D33). The gate driving circuit 420_2 serves to provide a plurality of even-numbered gate driving signals (such as G2 and G4), and operation of the gate driving circuit 420_2 may refer to that of the gate driving circuit 420_1.

Figure 5A:
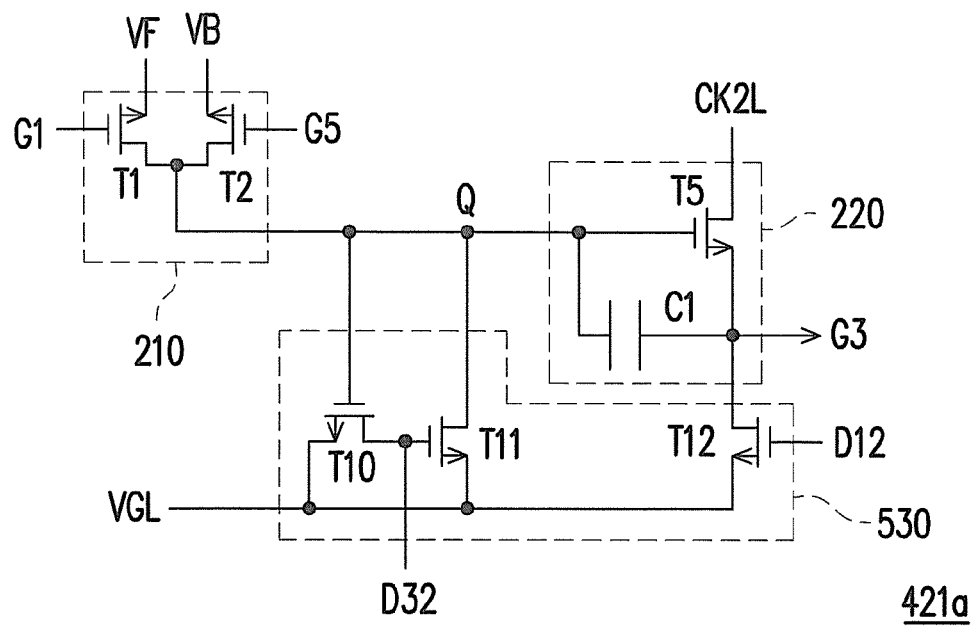
FIG. 5A is a schematic circuit diagram of a shift register according to still another embodiment of the invention.

FIG. 5A is a schematic circuit diagram of a shift register according to still another embodiment of the invention. Please refer to FIG. 2A, FIG. 4, and FIG. 5A. The shift register 421a is substantially the same as the shift register 121a, and the difference lies in a voltage pull-down unit 530, wherein the same or similar reference numbers are used herein to represent the same or similar components. In the present embodiment, the shift register 421a is assumed to receive the first pull-down signal D12 and the second pull-down signal D32, and the shift register 421a outputs the gate driving signal G3. The voltage pull-down unit 530 includes transistors T10 to T12 (corresponding to the tenth transistor to the twelfth transistor).

A drain of the transistor T10 (corresponding to the first terminal) receives the second pull-down signal D32, a source of the transistor T10 (corresponding to the second terminal) receives the gate low voltage VGL, and a gate of the transistor T10 (corresponding to the control terminal) receives the internal voltage Q. A drain of the transistor T11 (corresponding to the first terminal) is coupled to the internal voltage Q, a source of the transistor T11 (corresponding to the second terminal) receives the gate low voltage VGL, and a gate of the transistor T11 (corresponding to control terminal) receives the second pull-down signal D32. A drain of the transistor T12 (corresponding to the first terminal) is coupled to the gate driving signal G3, a source of the transistor T12 (corresponding to the second terminal) receives the gate low voltage VGL, and a gate of the transistor T12 (corresponding to the control terminal) receives the first pull-down signal D12.

Figure 5B:
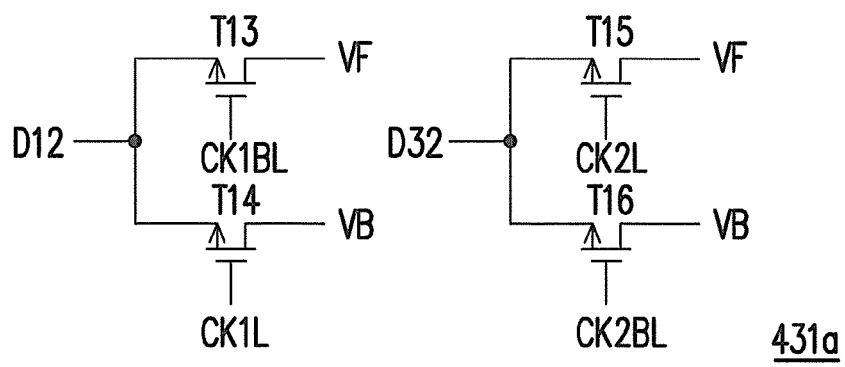
FIG. 5B is a schematic circuit diagram of a pull-down unit according to still another embodiment of the invention.

FIG. 5B is a schematic circuit diagram of a pull-down unit according to still another embodiment of the invention. Please refer to FIG. 4 and FIG. 5B. In the present embodiment, a pull-down unit 431a includes transistors T13 to T16 (corresponding to the thirteenth transistor to the sixteenth transistor). A drain of the transistor T13 (corresponding to the first terminal) receives the forward scanning voltage VF, a source of the transistor T13 (corresponding to the second terminal) is coupled to the first pull-down signal D12, and a gate of the transistor T13 (corresponding to the control terminal) receives the clock signal CK1BL (corresponding to the fifth clock signal). A drain of the transistor T14 (corresponding to the first terminal) receives the reverse scanning voltage VB, a source of the transistor T14 (corresponding to the second terminal) is coupled to the first pull-down signal D12, and a gate of the transistor T14 (corresponding to the control terminal) receives the clock signal CK1L (corresponding to the sixth clock signal).

A drain of the transistor T15 (corresponding to the first terminal) receives the forward scanning voltage VF, a source of the transistor T15 (corresponding to the second terminal) is coupled to the second pull-down signal D32, and a gate of the transistor T15 (corresponding to the control terminal) receives the clock signal CK2L (corresponding to the fifth clock signal). A drain of the transistor T16 (corresponding to the first terminal) receives the reverse scanning voltage VB, a source of the transistor T16 (corresponding to the second terminal) is coupled to the second pull-down signal D32, and a gate of the transistor T16 (corresponding to the control terminal) receives the clock signal CK2BL (corresponding to the sixth clock signal). The forward scanning voltage VF and the reverse scanning voltage VB may be set in the same manner as described in the embodiment shown in FIG. 2A and is not reiterated herein.

Figure 5C:
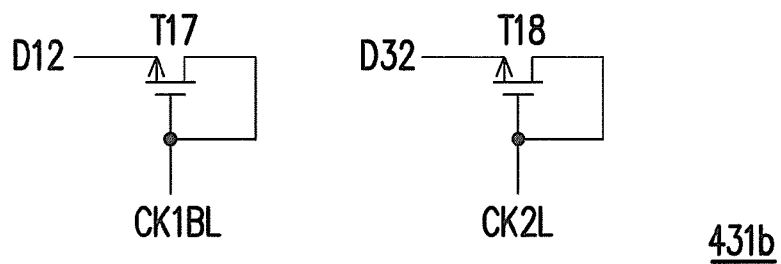
FIG. 5C is a schematic circuit diagram of a pull-down unit according to yet another embodiment of the invention.

FIG. 5C is a schematic circuit diagram of a pull-down unit according to yet another embodiment of the invention. Please refer to FIG. 5A to FIG. 5C. In the embodiment shown in FIG. 5A and FIG. 5B, the shift registers are applied to bidirectional scanning, whereas the pull-down unit 431b described herein is the shift register which is applied to unidirectional scanning. For instance, the pre-charge unit 210 of the shift register 421a is replaced by the pre-charge unit 310 shown in FIG. 3A. The pull-down unit 431b includes transistors T17 and T18 (corresponding to the seventeenth transistor and the eighteenth transistor). A drain (corresponding to the first terminal) and a gate (corresponding to the control terminal) of the transistor T17 receive the clock signal CK1BL (corresponding to the fifth clock signal), and a source of the transistor T17 (corresponding to the second terminal) is coupled to the first pull-down signal D12. A drain (corresponding to the first terminal) and a gate (corresponding to the control terminal) of the transistor T18 receive the clock signal CK2L (corresponding to the fifth clock signal), and a source of the transistor T18 (corresponding to the second terminal) is coupled to the second pull-down signal D32. As shown in FIG. 2C, enabling periods of the clock signals CK1BL and CK2L partially overlap, and the phase of the clock signal CK2L leads that of the clock signal CK1BL.

Figure 6:
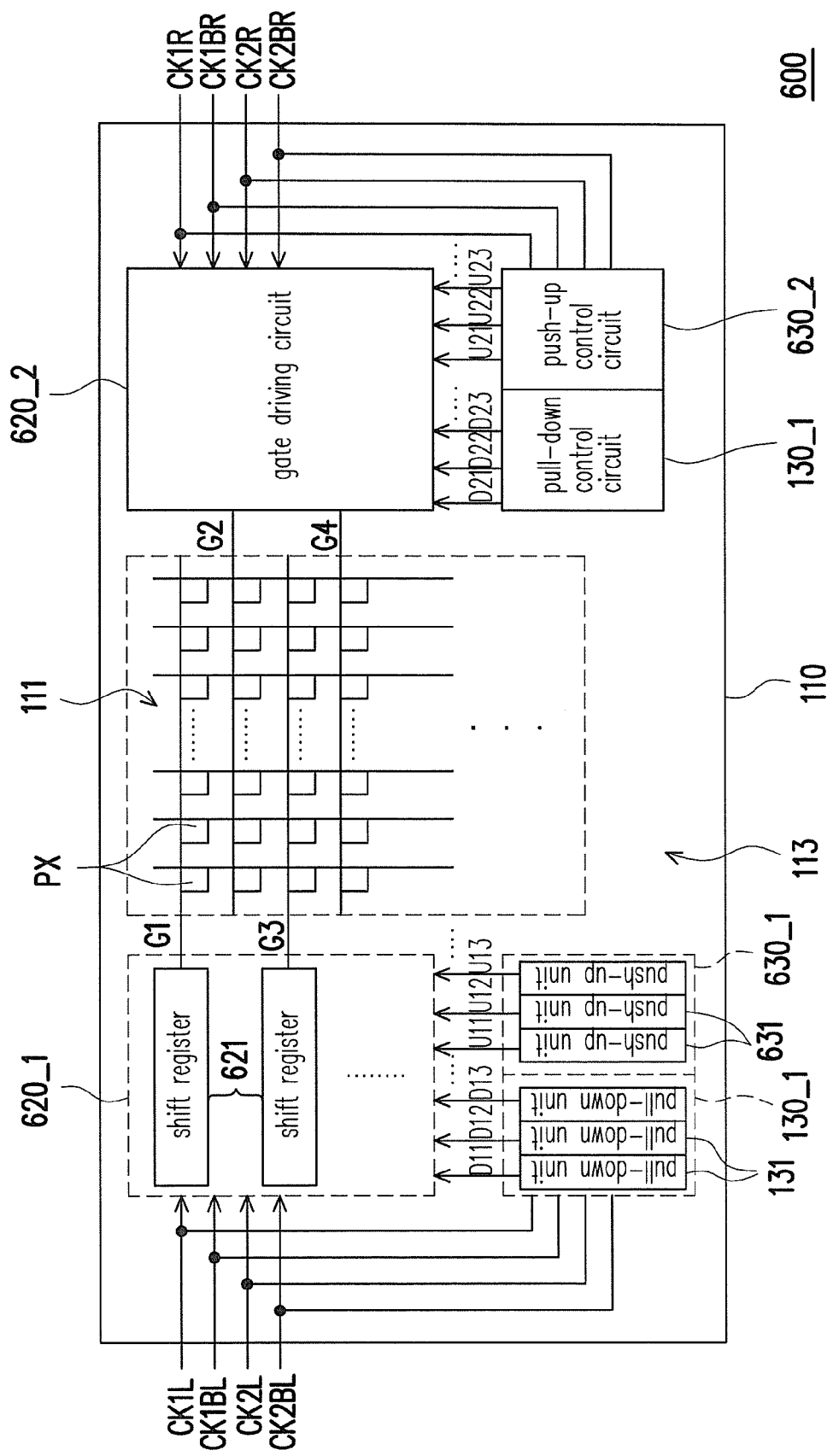
FIG. 6 is a schematic system diagram of a display panel according to still another embodiment of the invention.

FIG. 6 is a schematic system diagram of a display panel according to still another embodiment of the invention. Please refer to FIG. 1 and FIG. 6. A display panel 600 is substantially the same as the display panel 100. The differences between the display panels 600 and 100 lie in gate driving circuits 620_1 and 620_2 and push-up control circuits 630_1 and 630_2, wherein the push-up control circuits 630_1 and 630_2 are disposed on the peripheral area 113. The same or similar reference numbers are used herein to represent the same or similar components. The push-up control circuit 630_1 receives the clock signals CK1L, CK1BL, CK2L, and CK2BL, and the push-up control circuit 630_2 receives the clock signals CK1R, CK1BR, CK2R, and CK2BR. The push-up control circuit 630_1 has a plurality of push-up units 631 to provide a plurality of push-up signals (such as U11 to U13) to the gate driving circuit 620_1 according to the clock signals CK1L, CK1BL, CK2L, and CK2BL. The push-up control circuit 630_2 provides a plurality of push-up signals (such as U21 to U23) to the gate driving circuit 620_2 according to the clock signals CK1R, CK1BR, CK2R, and CK2BR, wherein operation of the push-up control circuit 630_2 may refer to that of the pull-down control circuit 630_1.

The gate driving circuit 620_1 has a plurality of shift registers 621 to provide a plurality of odd-numbered gate driving signals (such as G1 and G3), wherein each shift register 621 pulls down the corresponding odd-numbered gate driving signal (such as G1 and G3) according to the corresponding first pull-down signal (such as D11 to D13) and pushes up the corresponding odd-numbered gate driving signal (such as G1 and G3) according to the corresponding push-up signal (such as U11 to U13). That is, each shift register 621 enables the corresponding odd-numbered gate driving signal (such as G1 and G3). The gate driving circuit 620_2 is to provide a plurality of even-numbered gate driving signals (such as G2 and G4), wherein operation of the gate driving circuit 620_2 may refer to that of the gate driving circuit 620_1.

The gate driving circuit 620_1 and the push-up control circuit 630_1 are arranged in sequence along a left side of the display area 111; the gate driving circuit 620_2 and the push-up control circuit 630_2 are arranged in sequence along a right side of the display area 111. In the present embodiment, the push-up control circuit 630_1 is disposed below the gate driving circuit 620_1. In other embodiments, however, the push-up control circuit 630_1 may be disposed above the gate driving circuit 620_1 or the push-up control circuit 630_1 may be disposed both sides of below and above the gate driving circuit 620_1 at the same time, which may be modified by people having ordinary skill in the art. Similarly, the push-up control circuit 630_2 may not only be disposed below the gate driving circuit 620_2 but also be disposed above the gate driving circuit 620_2 or the push-up control circuit 630_2 may be disposed both sides of below and above the gate driving circuit 620_2 at the same time.

Figure 7A:
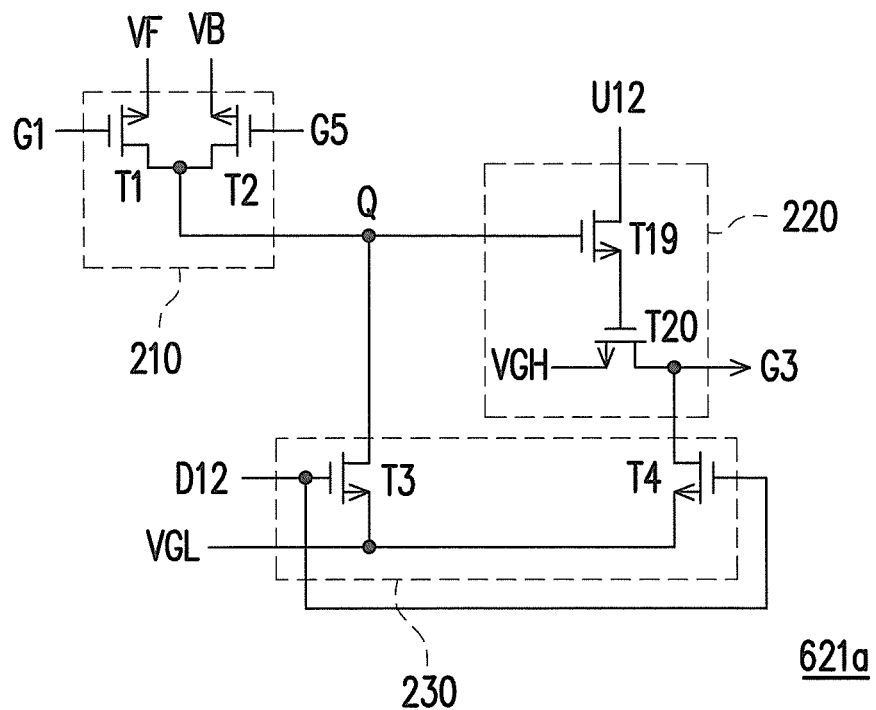
FIG. 7A is a schematic circuit diagram of a shift register according to yet another embodiment of the invention.

FIG. 7A is a schematic circuit diagram of a shift register according to yet another embodiment of the invention. Please refer to FIG. 2A, FIG. 6, and FIG. 7A. The shift register 621a is substantially the same as the shift register 121a, and the difference lies in a voltage push-up unit 720, wherein the same or similar reference numbers are used herein to represent the same or similar components. In the present embodiment, the shift register 621a is assumed to receive the first pull-down signal D12 and the push-up signal U12, and the shift register 621a outputs the gate driving signal G3. The voltage push-up unit 720 includes transistors T19 and T20 (corresponding to the nineteenth transistor and the twentieth transistor).

A drain of the transistor T19 (corresponding to the first terminal) receives the push-up signal U12, and a gate of the transistor T19 (corresponding to the control terminal) receives the internal voltage Q. A source of the transistor T20 (corresponding to the first terminal) is coupled to the gate high voltage VGH, a drain of the transistor T20 (corresponding to the second terminal) is coupled to the gate driving signals G3, and a gate of the transistor T20 (corresponding to control terminal) is coupled to a source of the transistor T19 (corresponding to the second terminal).

Figure 7B:
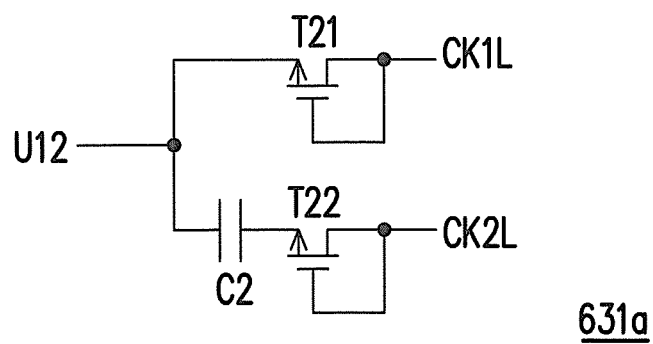
FIG. 7B is a schematic circuit diagram of a push-up unit according to an embodiment of the invention.

FIG. 7B is a schematic circuit diagram of a push-up unit according to an embodiment of the invention. Please refer to FIG. 6 and FIG. 7B. In the present embodiment, a push-up unit 631a includes transistors T21 and T22 (corresponding to the twenty-first transistor and the twenty-second transistor) and a capacitor C2 (corresponding to the second capacitor). A drain (corresponding to the first terminal) and a gate (corresponding to the control terminal) of the transistor T21 receive the clock signal CK1L (corresponding to the eleventh clock signal), and a source of the transistor T21 (corresponding to the second terminal) is coupled to the push-up signal U12. A drain (corresponding to the first terminal) and a gate (corresponding to the control terminal) of the transistor T22 receive the clock signal CK2L (corresponding to the twelfth clock signal). The capacitor C2 is coupled between a source of the transistor T22 (corresponding to the second terminal) and the push-up signal U12. As shown in FIG. 2C, enabling periods of the clock signals CK1L and CK2L partially overlap, and the phase of the clock signal CK1L leads that of the clock signal CK2L.

Figure 8:
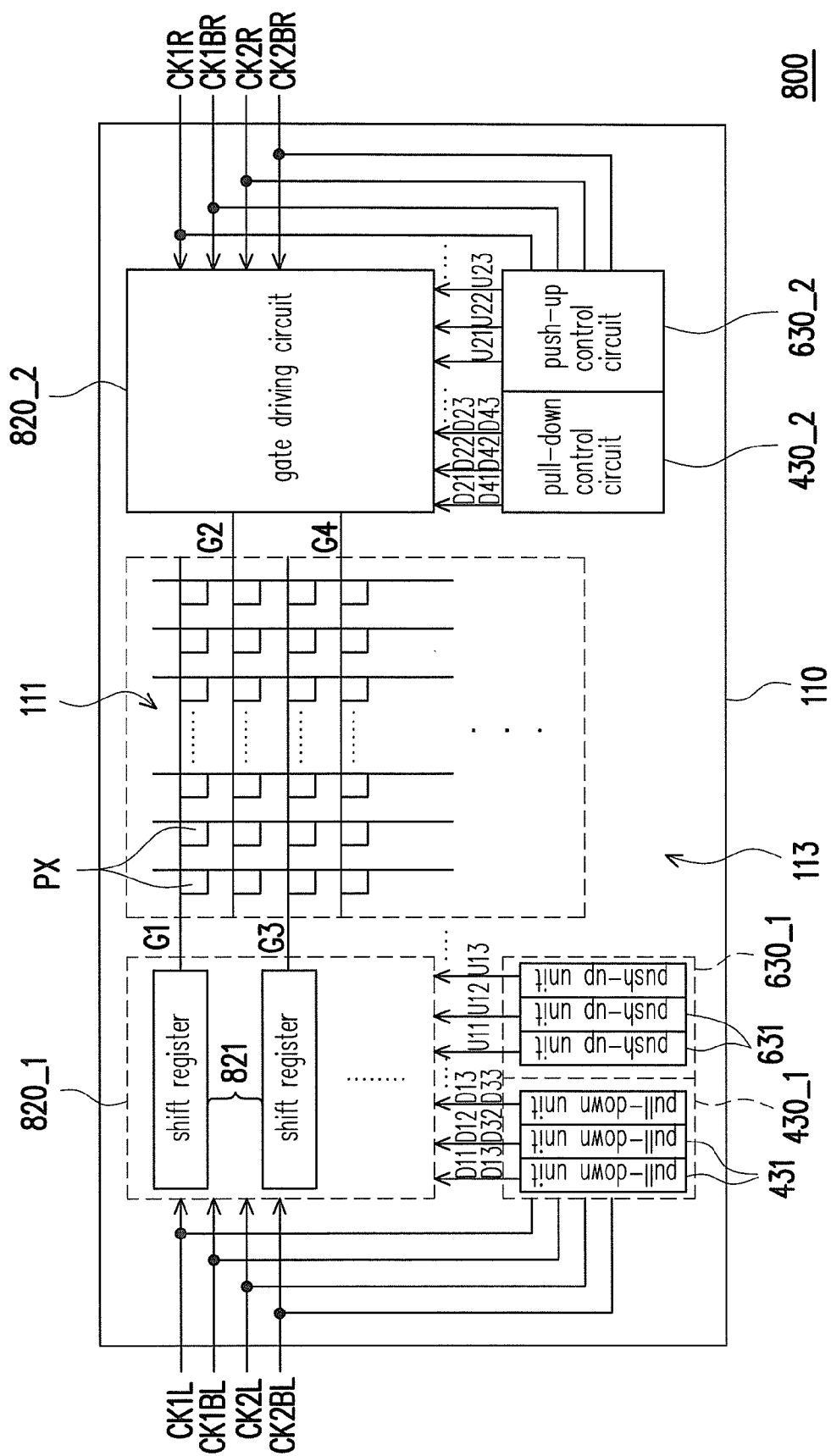
FIG. 8 is a schematic system diagram of a display panel according to yet another embodiment of the invention.

FIG. 8 is a schematic system diagram of a display panel according to yet another embodiment of the invention. Please refer to FIG. 4, FIG. 6, and FIG. 8. A display panel 800 is substantially the same as the display panel 600, but the pull-down control circuits 130_1 and 130_2 of the display panel 600 are replaced by pull-down control circuits 430_1 and 430_2 as shown in FIG. 4. Furthermore, the main difference lies in gate driving circuits 820_1 and 820_2, wherein the same or similar reference numbers are used herein to represent the same or similar components.

The gate driving circuit 820_1 has a plurality of shift registers 821 to provide a plurality of odd-numbered gate driving signals (such as G1 and G3), wherein each shift register 821 pulls down the corresponding odd-numbered gate driving signal (such as G1 and G3) and its internal voltage Q according to the corresponding first pull-down signal (such as D11 to D13) and the corresponding second pull-down signal (such as D31 to D33), and each shift registers 821 pushes up the corresponding odd-numbered gate driving signal (such as G1 and G3) according to the corresponding push-up signal (such as U11 to U13). That is, each shift register 821 enables the corresponding odd-numbered gate driving signal (such as G1 and G3). The gate driving circuit 8202 is to provide a plurality of even-numbered gate driving signals (such as G2 and G4), and operation of the gate driving circuit 820_2 may refer to that of the gate driving circuit 820_1.

When the shift register 821 is the shift register performing bidirectional scanning, the circuit of the shift register 821 may refer to those shown in FIG. 5A and FIG. 7A. That is, the circuit of the shift register 821 is similar to the circuit of the shift register 621a but the voltage pull-down unit 230 thereof is replaced with the pull-down unit 530 of the shift register 421a. Alternatively, when the shift register 821 is the shift register performing unidirectional scanning, the circuit of the shift register 821 may refer to those shown in FIG. 3A, FIG. 5A, and FIG. 7A. That is, the circuit of the shift register 821 is similar to the circuit the shift register 621a but the voltage pull-down unit 230 thereof is replaced with the pull-down unit 530 of the shift register 421a and the pre-charge unit 210 thereof is replaced with the pre-charge unit 310 of the shift register 121b.

Additionally, in the embodiments described above, the gate driving circuits (such as 120_1, 120_2, 420_1, 420_2, 620_1, 620_2, 820_1, and 820_2) are disposed on the both sides of the display area 111. In other embodiments, however, the gate driving circuits may be integrated into a single circuit and disposed on a side of the display area 111. Similarly, the pull-down control circuits (such as 130_1, 130_2, 430_1, and 430_2) may also be integrated into a single circuit and disposed on a side of the display area 111. In addition, the push-up control circuits (such as 630_1 and 630_2) may also be integrated into a single circuit and disposed on a side of the display area 111.

To sum up, in the embodiments of the invention, the display panel removes the pull-down control units from the shift registers of the gate driving circuit, so that the removed pull-down control units become an independent pull-down control circuit. Furthermore, in the embodiments of the invention, the gate driving circuits and the pull-down control circuits of the display panel are disposed in sequence along a side of the display area to reduce the circuit area of the gate driving circuits and to slim down the border of the display panel. Besides, the boost circuit in the shift registers may be removed, so that the removed boot circuit may become an independent push-up control circuit, and that the circuit area of the gate driving circuits may be further reduced.

What is claimed is:
1. A display panel, comprising:
   a substrate, having a display area and a peripheral area;
   a plurality of pixels, disposed on the display area;
   a plurality of scan lines, disposed on the substrate and respectively coupled to the corresponding pixels, the scan lines extending from the display area to the peripheral area;
   a pull-down control circuit, disposed on the peripheral area, the pull-down control circuit receiving a plurality of clock signals and having a plurality of pull-down units to provide a plurality of first pull-down signals; and
   a gate driving circuit, disposed on the peripheral area and having a plurality of shift registers, wherein the shift registers are coupled to the scan lines to provide a plurality of gate driving signals, the shift registers are coupled to the pull-down control circuit to receive the first pull-down signals, the shift registers enable the gate driving signals in sequence according to the clock signals, and the shift registers pull down the gate driving signals in sequence according to the first pull-down signals, respectively, wherein the pull-down control circuit and the gate driving circuit are arranged along a side of the display area,
wherein each of the shift registers comprises:
a pre-charge unit for pre-charging an internal voltage;
a voltage push-up unit, coupled to the pre-charge unit for pushing up $i^{th}$ gate driving signal of the gate driving signals according to the internal voltage, wherein i is an positive integer; and
a voltage pull-down unit, receiving the corresponding first pull-down signal for pulling down the internal voltage and the $i^{th}$ gate driving signal according to the corresponding first pull-down signal,
wherein the pull-down units further provide a plurality of second pull-down signals, and the voltage pull-down unit receives the corresponding second pull-down signal to pull down the $i^{th}$ gate driving signal according to the corresponding first pull-down signal and to pull down the internal voltage according to the corresponding second pull-down signal.

2. The display panel as claimed in claim 1, wherein enabling periods of the clock signals partially overlap and are different from one another.

3. The display panel as claimed in claim 1, wherein the pre-charge unit comprises:
a first transistor, wherein a first terminal of the first transistor receives a forward scanning voltage, a second terminal of the first transistor is coupled to the internal voltage, and a control terminal of the first transistor receives $(i-1)^{th}$ gate driving signal of the gate driving signals or a start signal; and
a second transistor, wherein a first terminal of the second transistor receives a reverse scanning voltage, a second terminal of the second transistor is coupled to the internal voltage, and a control terminal of the second transistor receives $(i+1)^{th}$ gate driving signal of the gate driving signals.

4. The display panel as claimed in claim 1, wherein the voltage push-up unit comprises:
a fifth transistor, wherein a first terminal of the fifth transistor receives a first clock signal of the clock signals, a second terminal of the fifth transistor is coupled to the $i^{th}$ gate driving signal, and a control terminal of the fifth transistor receives the internal voltage; and
a first capacitor, coupled between the second terminal and the control terminal of the fifth transistor.

5. The display panel as claimed in claim 4, wherein each of the pull-down units comprises:
a sixth transistor, wherein a first terminal of the sixth transistor receives a forward scanning voltage, a second terminal of the sixth transistor is coupled to the corresponding first pull-down signal, and a control terminal of the sixth transistor receives a second clock signal of the clock signals; and
a seventh transistor, wherein a first terminal of the seventh transistor receives a reverse scanning voltage, a second terminal of the seventh transistor is coupled to the corresponding first pull-down signal, and a control terminal of the seventh transistor receives a third clock signal of the clock signals.

6. The display panel as claimed in claim 5, wherein an enabling period of the first clock signal and an enabling period of the second clock signal partially overlap, the enabling period of the first clock signal and an enabling period of the third clock signal partially overlap, a phase of the first clock signal leads a phase of the second clock signal, and the phase of the first clock signal lags a phase of the third clock signal.

7. The display panel as claimed in claim 5, wherein the forward scanning voltage is one of a gate high voltage and a gate low voltage, and the reverse scanning voltage is the other one of the gate high voltage and the gate low voltage.

8. The display panel as claimed in claim 4, wherein each of the pull-down units comprises:
an eighth transistor, wherein a first terminal and a control terminal of the eighth transistor receive a fourth clock signal of the clock signals, and a second terminal of the eighth transistor is coupled to the corresponding first pull-down signal.

9. The display panel as claimed in claim 8, wherein an enabling period of the first clock signal and an enabling period of the fourth clock signal partially overlap, and a phase of the first clock signal leads a phase of the fourth clock signal.

10. The display panel as claimed in claim 1, wherein the voltage pull-down unit comprises:
a tenth transistor, wherein a first terminal of the tenth transistor receives the corresponding second pull-down signal, a second terminal of the tenth transistor receives a gate low voltage, and a control terminal of the tenth transistor receives the internal voltage;
an eleventh transistor, wherein a first terminal of the eleventh transistor is coupled to the internal voltage, a second terminal of the eleventh transistor receives the gate low voltage, and a control terminal of the eleventh transistor receives the corresponding second pull-down signal; and
a twelfth transistor, wherein a first terminal of the twelfth transistor is coupled to the $i^{th}$ gate driving signal, a second terminal of the twelfth transistor receives the gate low voltage, and a control terminal of the twelfth transistor receives the corresponding first pull-down signal.

11. The display panel as claimed in claim 1, wherein each of the pull-down units comprises:
a thirteenth transistor, wherein a first terminal of the thirteenth transistor receives a forward scanning voltage, a second terminal of the thirteenth transistor is coupled to the corresponding first pull-down signal, and a control terminal of the thirteenth transistor receives a fifth clock signal of the clock signals;
a fourteenth transistor, wherein a first terminal of the fourteenth transistor receives a reverse scanning voltage, a second terminal of the fourteenth transistor is coupled to the corresponding first pull-down signal, and a control terminal of the fourteenth transistor receives a sixth clock signal of the clock signals;
a fifteenth transistor, wherein a first terminal of the fifteenth transistor receives the forward scanning voltage, a second terminal of the thirteenth transistor is coupled to the corresponding second pull-down signal, and a control terminal of the fifteenth transistor receives a seventh clock signal of the clock signals; and
a sixteenth transistor, wherein a first terminal of the sixteenth transistor receives the reverse scanning voltage, a second terminal of the sixteenth transistor is coupled to the corresponding second pull-down signal, and a control terminal of the sixteenth transistor receives an eighth clock signal of the clock signals,
wherein enabling periods of the fifth clock signal, the sixth clock signal, the seventh clock signal, and the eighth clock signal overlap with one another, and according to phase sequence, these clock signals are arranged in an order of the sixth clock signal, the seventh clock signal, the fifth clock signal, and the eighth clock signal.

12. The display panel as claimed in claim 1, wherein each of the pull-down units comprises:
a seventeenth transistor, wherein a first terminal and a control terminal of the seventeenth transistor receive a ninth clock signal of the clock signals, and a second terminal of the seventeenth transistor is coupled to the corresponding first pull-down signal; and
an eighteenth transistor, wherein a first terminal and a control terminal of the eighteenth transistor receive a tenth clock signal of the clock signals, and a second terminal of the eighteenth transistor is coupled to the corresponding second pull-down signal,
wherein enabling periods of the ninth clock signal and the tenth clock signal partially overlap.

\* \* \* \* \*